(12) United States Patent
Roosen et al.

(10) Patent No.: US 7,318,874 B2
(45) Date of Patent: Jan. 15, 2008

(54) METHOD FOR JOINING CERAMIC GREEN BODIES USING A TRANSFER TAPE AND CONVERSION OF BONDED GREEN BODY INTO A CERAMIC BODY

(75) Inventors: Andreas Roosen, Erlangend (DE); Andreas Schröder, Hamburg (DE); Stephan Zöllner, Hamburg (DE)

(73) Assignee: tesa AG, Hamburg (DE)

( * ) Notice: Subject to any disclaimer, the term of this patent is extended or adjusted under 35 U.S.C. 154(b) by 0 days.

(21) Appl. No.: 10/472,628

(22) PCT Filed: Mar. 2, 2002

(86) PCT No.: PCT/EP02/02263

§ 371 (c)(1),
(2), (4) Date: Jan. 27, 2004

(87) PCT Pub. No.: WO02/074715

PCT Pub. Date: Sep. 26, 2002

(65) Prior Publication Data

US 2004/0112504 A1    Jun. 17, 2004

(30) Foreign Application Priority Data

Mar. 20, 2001    (DE)    ................. 101 13 361

(51) Int. Cl.
*C03B 29/00* (2006.01)
*B32B 7/12* (2006.01)
*B32B 37/12* (2006.01)

(52) U.S. Cl. ................. 156/89.11; 156/89.12; 156/89.16; 156/229; 156/235; 156/324; 428/210

(58) Field of Classification Search ............ 156/89.11, 156/89.12, 89.16, 247, 249, 289, 324, 230, 156/235, 238; 428/210
See application file for complete search history.

(56) References Cited

U.S. PATENT DOCUMENTS

| | | | | |
|---|---|---|---|---|
| 3,729,338 A | * | 4/1973 | Lehmann et al. | ...... 428/355 AC |
| 4,299,873 A | * | 11/1981 | Ogihara et al. | ............ 428/137 |
| 4,525,493 A | * | 6/1985 | Omura et al. | ................ 523/116 |
| 5,089,071 A | * | 2/1992 | Tominaga et al. | ........ 156/89.17 |
| 5,102,483 A | * | 4/1992 | Sawada et al. | .......... 156/89.12 |

(Continued)

FOREIGN PATENT DOCUMENTS

DE    196 15 400 A1    10/1997

(Continued)

OTHER PUBLICATIONS

Patent Abstracts of Japan—JP 05 148046; Sep. 27, 1993; Kikusui Kagaku Kogyo KK; "Sheetlike Adhesive Material and Method for Bonding Thereof".

(Continued)

*Primary Examiner*—Melvin Mayes
(74) *Attorney, Agent, or Firm*—Norris, McLaughlin & Marcus PA

(57) ABSTRACT

The invention relates to a ceramic green body consisting of at least two ceramic bodies that are bonded together. The invention is characterized in that the green body is produced using an adhesive tape that consists of an adhesive film located on a release liner.

14 Claims, 1 Drawing Sheet

U.S. PATENT DOCUMENTS

Figure 1:
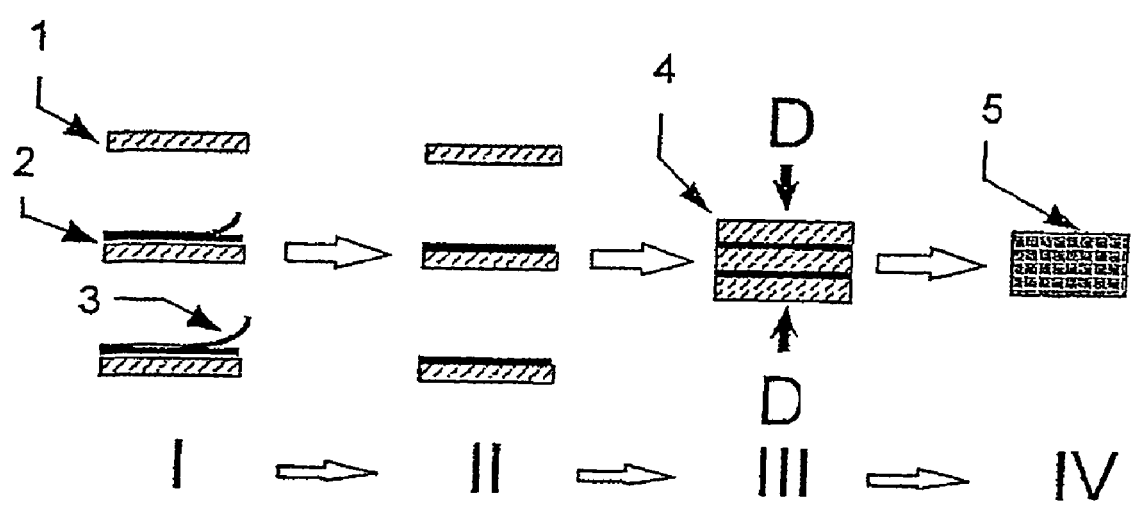

| | | | | |
|---|---|---|---|---|
| 5,304,274 | A | * | 4/1994 | Crownover et al. ........ 156/230 |
| 5,858,145 | A | * | 1/1999 | Sreeram et al. .......... 156/89.16 |
| 6,284,369 | B1 | * | 9/2001 | Kume et al. .......... 428/355 AC |
| 6,455,151 | B1 | * | 9/2002 | Sakashita et al. ........... 428/343 |
| 6,592,696 | B1 | * | 7/2003 | Burdon et al. ........... 156/89.12 |
| 2001/0007003 | A1 | * | 7/2001 | Karim et al. ............ 525/330.5 |
| 2004/0011453 | A1 | * | 1/2004 | Roosen et al. .......... 156/89.11 |

FOREIGN PATENT DOCUMENTS

| | | | |
|---|---|---|---|
| DE | 197 25 948 A1 | | 12/1998 |
| JP | 54-130609 | * | 10/1979 |
| JP | 57-22183 | * | 2/1982 |
| JP | 1-205595 | * | 8/1989 |
| JP | 2-219603 | * | 9/1990 |
| JP | 6-71633 | * | 3/1994 |
| JP | 6-104572 | * | 4/1994 |

OTHER PUBLICATIONS

Internet Translation of the first paragraph of the Example DE 197 25 948 published on Dec. 24, 1998.

M. Piwonski et al., "Low Pressure Lamination of Ceramic Green Tapes by Gluing at Room Temperature"; J. European Ceramic Soc., 19; 263-270 (1999).

* cited by examiner

METHOD FOR JOINING CERAMIC GREEN BODIES USING A TRANSFER TAPE AND CONVERSION OF BONDED GREEN BODY INTO A CERAMIC BODY

This application is a 371 of PCT/EP02/02263, filed Mar. 2, 2002.

The invention relates to a method of producing a close physical bond between ceramic or powder-metallurgical green bodies so that these are firmly joined to one another after sintering. The method is particularly useful for the lamination of green ceramic sheets for producing functional and engineering ceramics, for example highly integrated multilayer circuits, housings, capacitors, actuators, sensors, HT fuel cells, heat exchangers, etc./88 Roo/,/96 Hel/. The invention further relates to the green ceramic bodies and their use.

The basis of ceramic lamination technology is provided by green ceramic sheets which are produced by tape casting/ 88 Roo/,/96 Hel/. The green sheets have a thickness of from 10 μm to 2 mm and comprise ceramic powder embedded in a polymer matrix, frequently a matrix based on polyvinyl butyral (PVB). Added plasticizers give the sheet a certain flexibility. Prior to lamination, the individual layers of the green sheets to be laminated can, depending on the application, be structured, i.e. provided with passages or other recesses or structures, and printed with metal pastes.

One possible lamination method is the thermocompression process in which lamination is carried out under pressure and the action of heat. In this process, the sheets are stacked and then pressed/94 Ree/under pressures of from 15 MPa/86 Boc/to 100 MPa/95 Tuf/at temperatures of from 60° C./86 Boc/to about 110° C. /97 Cha/. The increased temperature is necessary for softening the binder (polymer). In thermocompression under isostatic conditions, pressures up to 400 MPa are used. Pressure and temperature are dependent on one another: a low temperature requires a higher pressure, and vice versa.

To achieve a good, defect-free bond, it is important/96 Hel/that during lamination the powder particles in the green sheet surfaces which are in contact reorient and intermeshing of the powder particles in the contact surfaces between the sheets occurs. The driving force for the rearrangement of the powder grains is the externally applied pressure in combination with the softening of the polymer. To make reorientation possible, the green sheet has to meet a few requirements. The relative volumes of the pores, of the powder and of the binder have to be in a particular ratio relative to one another/96 Hel/.

The disadvantages of this thermocompression process are
The time taken, since the pressure has to be held for some time, depending on the number of layers, at elevated temperature to reach thermal equilibrium within the stack of sheets to be laminated. A continuous process is therefore ruled out right from the beginning.
Elevated pressure and temperature in thermocompression, which lead to mass flow and thus deformation of the original geometry. For this reason, molds (dies) have to be used to avoid deformation of the laminate in terms of its length, width and thickness.

Further problems occur in the production of void structures by sheet-wise buildup of structured laminates (heat exchangers/87 Hei/).

In the formation of layered structures, holes are sometimes punched into the green sheets. Superposing the individual layers and joining them by means of lamination then results, for example in the case of the heat exchanger, in channel systems. When thermocompression is used, the cavities in the green sheets lead to an inhomogeneous pressure distribution in the laminate with sometimes unsatisfactory transmission of pressure, leading to unsatisfactory lamination and thus to undesirable delamination, i.e. the sheets are not continuously joined together after sintering. The damage zones lead to property changes, so that the part becomes a reject.

Achieving fine structures, for example honeycombs or very fine interconnects, in the laminate is particularly problematical since these are destroyed by the applied pressure and temperature due to the associated mass flow.

The method requires particular microstructures of the green sheets in respect of the ratio of pores, powder and binder to one another.

Binders which are used in water-based sheets respond less well to thermocompression than do sheets produced from slips based on organic solvents.

In the thermocompression process, attempts have hitherto been made to overcome these problems by means of lamination aids consisting essentially of solvent and binder. They have the function of partially dissolving the surface of the green sheets so that lower pressures and temperatures can be employed. Disadvantages are that application of the lamination aid requires an additional process step and that partial dissolution of the binder results in the laminate being deformed more readily. The abovementioned temperature and pressure ranges also apply to the use of lamination aids.

This problem has been elevated by the introduction of the "cold low-pressure lamination process" as disclosed in DE 197 25 948 A1 (see also /99 Piw/). In this process, the unprinted or printed green sheets are adhesively bonded to one another at room temperature using a double-sided adhesive tape under light pressure (hand pressure). The support film allows the green sheets to be joined to fully sintered bodies without intermeshing of the particles (see thermocompression: pressure and temperature) being present during lamination.

In contrast thereto, in the case of cold low-pressure lamination, the green sheets are separated from one another by a polymeric support film after adhesive bonding. This support film is responsible for a bond between two sheets being established during the further course of heat treatment and sintering. At elevated temperatures, the film becomes a fluid melt. Due to the capillary structure of the ceramic body (pore structure) from which the other organic auxiliaries have already largely been burned out, the melt soaks into the pore channels. The resulting capillary forces draw the two bodies together. In the liquid polymer melt, the ceramic powder particles can slide between one another so that the required intermeshing occurs. For this to occur, the ceramic powder particles have to be freely mobile, i.e. the organic additives present in the green sheet have to have been largely driven off, and no neck formation must as yet have occurred during sintering since this would likewise reduce the mobility.

In this process, the pressure necessary to achieve intermeshing of the individual layers of ceramic sheet is not applied externally by pressing at simultaneously elevated temperature, but is generated between the layers by the capillary forces produced by formation of the polymer melt, i.e. in the green body microstructure, viz. in situ.

The advantages of the process are clear:

Lamination is carried out at room temperature and very low pressures. This saves time and energy, since heating and holding at an elevated temperature is dispensed with.

This eliminates the delay time required in thermocompression for the elevated temperature to equilibrate. As a result, continuous manufacture of laminates is possible. Both the green sheet and the double-sided adhesive tape can be taken off from rolls.

The binder of the green sheet is not yet softened at room temperature, so that lamination can be carried out without a mold. Tool costs can be saved as a result.

Since the binder does not soften, there is also no mass flow. As a result, complicated, three-demensional structures having hollow spaces can also be realized.

Since the pressure for intermeshing of the sheets is generated by capillary forces, it is uniformly distributed throughout the laminate, even in complex structures having hollow spaces or very fine interconnects. As a result, no delaminations or seams are formed in the material.

The process also works in the case of sheets produced on an aqueous basis.

Furthermore, other green ceramic bodies can also be joined to one another using this method.

A disadvantage of the method using double-sided adhesive tapes is the thickness of the double-sided tape and thus the amount of material which has to be burned off in the ceramic burn-out process. Here, the adhesive has only the function of adhesive bonding, while the support film has to form a polymer melt which is critical to a satisfactory result from the adhesively bonded sheets. In the process, the adhesive firstly has to be burned out before the polymer melt is formed from the support film.

This method is improved by the double-sided adhesive tape being replaced by a printable adhesive composition. The liquid adhesive can be applied to the sheets to be joined by a screen printing process; screen printing processes are already process-integrated into ceramic sheet technology for metallization. In this method, The viscosity of the adhesive can be adapted within certain limits.

A disadvantage of the method using screen-printable adhesives is the production of an adhesive layer which is extremely dust-sensitive. In ceramics, such dust particles have to be kept away from the functional surfaces of the green sheets, since they would destroy the small structures and lead to defects (pores) in the sintered ceramic, which drastically reduces the strength (ceramic is a brittle material). Thus, a sheet which has been screen-printed with adhesive has to be immediately processed further, i.e. intermediate storage as is frequently desired in manufacture and may include stacking is not possible. Furthermore, the screen printing of adhesives requires a drying step in order to drive off the solvent which is used in significant amounts. Furthermore, application of solvents to the sheets leads to swelling of the green sheets, which is regarded as unfavorable in screen printing of the metallization alone.

REFERENCES

/86 Boc/P. Boch, C. Chartier, M. Huttepain, "Tape Casting of $Al_2O_3/ZrO_2$ Laminated Composites", J. Am. Ceram. Soc. 69[8] (1986) C191-C192

/87 Hei/J. Heinrich, J. Huber, H. Schelter, R. Ganz, R. Golly, S. Foerster, P. Quell, "Compact Ceramic Heat-Exchangers: Design, Fabrication and Testing", Brit. Ceram. Trans. J. 86[6] (1987) 178-182

/88 Roo/A. Roosen, Basic requirements for tape casting of ceramic powders, in Ceram. Transactions, Vol. 1, Part B, Ceramic Powder Science, Am. Ceram. Soc., Inc., Columbus, Ohio, 1988, pp. 675-692

/89 Cim/M. J. Cima, M. Dudziak, J. A. Lewis, "Observation of Poly(vinyl Butyral) Dibutyl Phthalate Binder Capillary Migration", J. Am. Ceram. Soc., 72[6] (1989), 1087-1090

/94 Ree/J. S. Reed, Principles of Ceramics Processing, 2nd Ed., John Wiley & Sons, New York, 1994

/95 Tuf/S. Tuffe, D. S. Wilkinson, "$MoSi_2$-Based Sandwich Composite Made by Tape-Casting", J. Am. Ceram. Soc., 78[11] (1995), 2967-2972

/96 Hel/H. Hellebrand, "Tape Casting", pp. 189-265 in Materials Science and Technology, Vol. 17 A, Processing of ceramics, Part 1, ed R. J. Brook, VCH Verlagsgesellschaft, Weinheim, FRG 1996

/97 Cha/T. Chartier, T. Rouxel, "Tape-Cast-Alumina-Zirconia Laminates: Processing and Mechanical Properties", J. Eur. Ceram. Soc. 17[2-3] (1997), 299-308

/99 Piw/M. Piwonski, A Roosen; Low Pressure Lamination of Ceramic Green Tapes by Gluing at Room Temperature. J. Europ. Ceran. Soc. 1999, 19, 263-270

It is an object of the invention to provide a green ceramic body which originates from a further process-engineering simplification of cold low-pressure lamination so that the disadvantages of the prior art are alleviated.

This object is achieved by a composite green ceramic body comprising at least two green ceramic bodies adhesively bonded to one another, wherein the composite green ceramic body has been produced using an adhesive tape comprising an adhesive flim on a release liner.

A method which is more elegant than the use of double-sided adhesive tapes or of screen printing pastes is the use of an adhesive tape consisting of an adhesive film applied to a release liner, known as a transfer tape.

The double-sided adhesive tape consists of two layers of adhesive which have been applied to a support and are provided with covering sheets which serve to protect the adhesive layers and are pulled off prior to adhesive bonding. In the cold low-pressure process, the adhesive layers serve to fix and temporarily join the green ceramic bodies to be laminated together. The internal support film serves, during the later burn-out of the organic constituents, to form a liquid phase which produces capillary forces (see above). Due to this multilayer structure, the adhesive tape is relatively thick.

A much simpler structure is obtained when a transfer tape is used. This adhesive tape comprises a film adhesive on a release liner which protects the adhesive film in the manner of a covering sheet. This adhesive film is applied to one of the green bodies to be adhesively bonded and the liner can be putled off at any time prior to use. There is therefore now only one adhesive film between the two green ceramic bodies.

This monolithic adhesive film combines the two functions performed by the double-sided adhesive tape with its three layers in one layer.

It adhesively bonds the sheets to be joined together at temperatures of <100° C. and it forms a liquid phase at elevated temperatures to produce capillary forces.

This is described in detail below:

This adhesive film (transfer film) should meet certain requirements. At the use temperature, it should be tacky so that it can be transferred to the green sheet. This can be achieved by transcalendering on a laminator or other customary equipment. In some cases, it can be particularly advantageous for heat and a light pressure to be employed for this procedure.

In a preferred embodiment, the adhesive film is particularly thin so that not too much excess material has to be driven off during binder burn-out or sintering. Suitable and preferred layer thicknesses are from 2 to 50 µm, particularly preferably from 5 to 25 µm.

A very particularly favorable lamination result is obtained when the adhesive film or the adhesive tape is oriented. An adhesive film which is oriented in the x-y direction prior to consolidation or crosslinking shrinks on heating, resulting not only in the generation of capillary forces but also in additional drawing-together of the material being laminated.

The pressure sensitive adhesive has to have a nature such that it liquefies sufficiently at elevated temperatures for the melt to be able to flow into the pores of the ceramic and thus generate the necessary capillary forces in the porous green bodies. An advantageous temperature range is from 200° C. to 600° C., preferably from 250° C. to 550° C. Only then is the adhesive decomposed completely.

It has been found that copolymers of acrylates and methacrylates meet these requirements particularly well. The composition of the copolymers is chosen so that the resulting pressure sensitive adhesive compositions have pressure-sensitive-adhesive properties corresponding to D. Satas [Handbook of Pressure Sensitive Adhesive Technology, 1989, VAN NOSTRAND REINHOLD, New York].

Preferred starting materials for the adhesive film are mixtures of a) derivatives of acrylic acid and/or methacrylic acid corresponding to the formula
   $CH_2=CH(R_1)(COOR_2)$ where
   $R_1=H$ or $CH_3$ and
   $R_2=$ a branched or unbranched alkyl chain having from 2 to 20 carbon atoms, and
b) olefinically unsaturated monomers having functional groups, with further components being able to be added to the pressure sensitive adhesive composition.

It is advantageous to choose the composition of the pressure sensitive adhesive composition so that the component a) is present in an amount of from 70 to 99% by weight, in particular from 80 to 99% by weight, and/or the component b) is present in an amount of from 1 to 30% by weight, in particular from 1 to 20% by weight, where the. sum of these components and any further components or additives is 100% by weight.

To prepare the acrylate pressure sensitive adhesive composition, a free-radical polymerization is carried out. The free-radical polymerization can be carried out in the presence of an organic solvent, in water, in mixtures of organic solvents or of organic solvents and water, or in bulk. Preference is given to using as little solvent as possible. The polymerization time is, depending on conversion and temperature, in the range from 6 to 48 hours.

In solvent polymerization, solvents used are preferably esters of saturated carboxylic acids (e.g. ethyl acetate), aliphatic hydrocarbons (e.g. n-hexane or n-heptane), ketones (e.g. acetone or methyl ethyl ketone), petroleum spirit fractions or mixtures of these solvents. Polymerization initiators used are customary free-radical-forming compounds such as peroxides and azo compounds. It is also possible to use initiator mixtures. In the polymerization, it is advantageous to use thiols as further regulators to reduce the molecular weight and decrease the polydispersity. As polymerization regulators, it is possible to use, for example, alcohols and ethers.

The polymerization for preparing the acrylate pressure sensitive adhesive composition can be carried out in polymerization reactors which are generally provided with a stirrer, a plurality of feed stream containers, reflux condenser, heating and cooling and are equipped for working under an $N_2$ atmosphere and superatmospheric pressure.

After the polymerization in solution, the polymerization medium can be removed under reduced pressure and at elevated temperatures, for example in the range from 80 to 150° C. The polymers can then be used in a solvent-free state, in particular as hot melt pressure sensitive adhesive. In some case, it is also advantageous to prepare the polymers in bulk.

The polyacrylates can also be modified further to improve the adhesive properties. Thus, crosslinkers or photoinitiators can be additionally added to increase cohesion prior to crosslinking. As crosslinkers, it is possible to use all bifunctional or multifunctional compounds whose functional groups can undergo a linking reaction with the polyacrylates. Particular mention may here be made of polymerization, polycondensation and polyaddition reactions. In the case of acrylate hot melts, preference is given to multifunctional acrylates which function as crosslinkers during UV curing or curing by means of ionizing radiation. As photoinitiators, it is possible to use, for example, derivatives of benzophenone, acetophenone, benzyl, benzoin, hydroxyalkylphenone, phenyl cyclohexyl ketone, anthraquinone, thioxanthone, triazine or fluorenone.

Furthermore, the polymers can optionally be admixed with resins for producing pressure sensitive adhesive compositions. Examples of resins which can be used are terpene resins, terpene-phenol resins, $C_5$- and $C_9$-hydro-carbon resins, pinene resins, indene resins and rosins, either alone or in combination with one another. However, it is in principle possible to use all resins which are soluble in the respective polyacrylate, in particular all aliphatic, aromatic, alkylaromatic hydrocarbon resins, hydrocarbon resins based on pure monomers, hydrogenated hydrocarbon resins, functional hydrocarbon resins and natural resins.

The acrylate hot melts or adhesive compositions in general can further comprise one or more additives such as aging inhibitors, light stabilizers, agents to protect against ozone, fatty acids, compounding aids and/or accelerators. Inorganic fillers can also be present.

To produce adhesive tapes, the pressure sensitive adhesive composition can be further processed from the melt, in particular applied to a support. It is particularly advantageous for the coating to be applied from the melt, since the layer can then be stretched and oriented in the x-y direction. A layer which has been oriented in this way, particularly when it is crosslinked after stretching, can recover its dimensions on heating. This recovery force leads, in addition to the capillary force, to an improved lamination result. Fine-pored green sheets can also be laminated in this way.

The green ceramic sheets are particularly advantageously used for sintering of ceramics.

In a preferred variant, the green ceramic body after adhesive bonding is subjected to at least one heat treatment during which the polymer matrix of the green sheets is firstly at least largely thermally decomposed and/or vaporized, the transfer tape is subsequently decomposed and the green body is then sintered to form the actual ceramic product.

Sintering is preferably carried out at temperatures of from 700° C. to 2000° C.

The advantages of the method of the invention are:

- The three-layer structure of the double-sided adhesive tape with its two different materials has been successfully converted into an adhesive film of a single material. This material performs the two necessary functions: adhesive bonding and formation of a polymer melt.
- Since the transfer tapes are thinner than the double-sided adhesive tapes, the amount of organics to be driven off during the overall thermal treatment of the ceramic (binder burn-out and sintering) decreases, which leads to considerable advantages in terms of the heating rate and reduces the risk of damage.
- Furthermore, the adhesive can be processed other than as a liquid adhesive from the roll. This provides, in a simple manner, an opportunity for continuous production of laminates. Both the green sheet and the transfer tape can be drawn off from rolls. The adhesive tape can firstly be applied to the individual strips of green sheets by means of rollers. After pulling the silicone paper from the transfer tape, the individual layers can then be joined by means of pressure rollers. This produces a continuous laminate which can be divided into small units by stamping. This makes it possible to produce large numbers of pieces, which increases the efficiency and reduces the unit costs.
- The sheets can be stacked and stored temporarily before release of the adhesive layer.
- No drying step is necessary, since the transfer tape is not applied in liquid form.
- Since the transfer tape contains no solvent, it is not possible for a solvent to penetrate into the green sheet. As a result, no swelling (change of dimensions) of the sheet occurs.
- The transfer tape is readily deformable and can thus adapt to unevennesses and therefore has a leveling effect similar to regions metallized using liquid adhesives. The tape is deformable since it does not contain a rigid film like the double-sided adhesive tapes.
- The method has, as a cold low-pressure process, all the advantages of the latter process which have been indicated above.

The way in which this transfer tape functions is based on it being converted in to a fluid melt at elevated temperatures. As a result of the capillary structure of the ceramic body, in which the other organic auxiliaries have largely been burned out, the melt soaks into the pore channels. The capillary forces which occur as a result draw the two bodies together. The ceramic powder particles can also slide between one another in the liquid polymer melt so that the required intermeshing occurs. For this purpose, the ceramic powder particles have to be freely mobile. The organic additives which are present in the green sheet have to have been largely driven off and neck formation must not yet have occurred during sintering, since this would likewise reduce the mobility.

The method demonstrated here for green ceramic sheets can be employed quite generally for joining ceramic or powder-metallurgical green bodies or presintered bodies having a sufficient residual porosity.

The method comprises two essential steps:
1. Application of the transfer tape and adhesive bonding of the bodies to be joined and
2. the heat treatment for driving off the binder and the transfer tape and subsequent sintering of the bodies to full density.

Thus, to produce a ceramic body, an adhesive tape comprising a film of adhesive on a release liner is preferably firstly applied to a first green ceramic body, at least in regions and at least on one side. The release liner is then removed, and the first green ceramic body is subsequently adhesively bonded to the second ceramic body.

In an advantageous embodiment of the invention, the green bodies are green sheets, preferably at least two green ceramic sheets adhesively bonded to one another, with the green sheets being able to be unmetallized or metallized.

Further preference is given to the green bodies being, after application of the adhesive tape and removal of the release liner, adhesively bonded to one another by means of, in particular, light pressure; in the case of green sheets as green ceramic bodies, this occurs in the stacked state.

The invention is illustrated below with the aid of an example and a figure, without the invention being restricted thereto.

The method of the invention is based on adhesive bonding of the layers of green sheets using a suitable transfer tape at room temperature. This transfer tape consists of a 30 μm thick layer of an acrylate pressure sensitive adhesive composition on a release liner which has been coated with silicone on both sides. The total thickness of the transfer tape is 100 μm. The transfer tape can be present in sheet form or wound up in the form of rolls. The release liner allows the transfer tape to be applied to and pressed onto the green sheet. Before joining to a further layer of green sheet, the silicone paper has to be pulled off.

The acrylate pressure sensitive adhesive composition. is a copolymer of 98% by weight of 2-ethylhexyl acrylate and 2% by weight of acrylic acid ($M_w$: 820,000, D: 4.2), which has been prepared conventionally by means of a free-radical polymerization in solution (acetone/petroleum spirit fraction 1:1).

Polymerization/transfer tape production A 2 l glass reactor conventional for free-radical polymerizations was charged with 8 g of acrylic acid, 392 g of 2-ethylhexyl acrylate, 266 g of acetone/petroleum spirit 60.95 (1:1) and 8 g of isopropanol. After nitrogen. gas had been passed through the reaction solution for 45 minutes while stirring, the reactor was heated to 58° C. and 0.2 g of AIBN [2,2'-azobis(2-methylbutyronitrile)] was added. The external heating bath was subsequently heated to 75° C. and the reaction was carried out at this constant external temperature. After 2 hours, another addition of 0.2 g of AIBN [2,2'-azobis(2-methylbutyronitrile)] was carried out. After 4 and 8 hours, the mixture was in each case diluted with 100 g of acetone/petroleum spirit mixture. After a reaction time of 36 hours, the polymerization was stopped and the reaction vessel was cooled to room temperature.

This pressure sensitive adhesive composition was applied in a thickness of 30 μm to the release liner (glassine paper coated with silicone on both sides and having gradated release) from solution on a coating unit and was subsequently dried at 100° C. for 10 minutes.

Many laminating experiments were carried out using the transfer tape. The green sheet used in these was based on aluminum oxide having a mean particle size of 3.5 μm and polyvinyl butyral as binder, dibutyl phthalate as plasticizer and corresponds to the composition of customary slip systems/88 Roo/. A green sheet is produced from this slip by tape casting and drying. The cast sheet has a thickness of 725 μm and a mean pore size of 0.6 μm. For the lamination experiments, the sheet was cut into squares having an edge length of 30 mm. Laminates of three layers were produced in the experiments.

The lamination technique is illustrated in FIG. 1. The following steps are necessary:
I application of the transfer tape 2
II removal of the silicone paper
III pressing
IV sintering To carry out the lamination, the transfer tape 2 was applied to the individual pieces of green sheet 1. After pulling off the silicone paper 3, the individual layers were stacked on top of one another and pressed together under a light pressure D to form the laminate 4.

A laminate 4 was produced by gently pressing the layers of sheets by hand. Further laminates 4 were obtained by pressing under pressures of 2.5 MPa and 5 MPa. The laminates were subsequently subjected to binder burn-out and sintered by means of an appropriate furnace program to give a monolithic ceramic body 5 in which the transfer tapes are no longer present. In all three cases, polished sections of the sintered laminates revealed no defects or seams in the laminates.

The effectiveness of the novel technique requires an adhesive which fixes the green sheets during lamination. The adhesive composition is pressure sensitive, which is why bonding is possible even at low applied pressures. During binder burn-out, i.e. during the temperature increase during firing, the binder firstly burns out from the green sheet. The polymer of the transfer tape remains stable to about 250° C. and then forms a low-viscosity melt whose viscosity decreases with increase in temperature as a result of rupture of the chains of the polymer molecules. At 300° C., dynamic viscosities of the adhesive of about 30 Pas were measured (for comparison: according to Cima /89 Cim/, polyvinyl butyral has a viscosity of about 5000 Pas at 160° C.). The polymer melt is removed by flowing away via the pores of the ceramic layers and by vaporization of short-chain cracking products.

It is possible to use adhesives which, during the burn-out process, form a liquid phase in a temperature range in which the organic auxiliaries used in the green body have very largely decomposed or liquefied. The polymer melt in the porous capillary system of the green sheet leads to capillary forces which in turn as capillary pressure draw in the polymer melt. These capillary forces draw the individual layers of the ceramic sheets together. In the low-viscosity melt, the powder particles close to the surface can reorient, so that when the individual layers come close together they intermesh and produce a homogeneous bond. As the temperature is increased further, densification of the bodies leads to elimination of the interface between the bodies, as a result of which the bodies are firmly joined to one another and the original interfaces are no longer discernable.

The organic auxiliaries used in the green bodies should begin to decompose or liquefy in the respective green bodies below the liquefaction temperature of the transfer tape, so that these organic additives no longer fix the powder particles when the transfer tape becomes liquid, so that they are freely mobile.

The ceramic or powder-metallurgical green body should have a porosity of >10% by volume based on the inorganic particles and the individual powder particles should be isolated, i.e. sinter neck formation must not yet have taken place so that the powder particles can still move relative to one another before the organic additives have been completely burned out.

The method is particularly useful for laminating green ceramic sheets for producing functional and engineering ceramics, for example housings, highly integrated circuits, capacitors, actuators, sensors, HT fuel cells, heat exchangers, etc. The green ceramic bodies of the invention produced as intermediates are, after adhesive bonding, subjected to at least one heat treatment during which the polymer matrix of the green sheets is firstly at least largely thermally decomposed and/or vaporized and the transfer tape is subsequently decomposed and the green body is then sintered to form the actual ceramic product. Sintering is preferably carried out at temperatures of from 700° C. to 2000° C.

The invention claimed is:

1. A composite green ceramic body comprising at least two green ceramic bodies adhesively bonded to one another with an adhesive film, wherein the adhesive film is oriented and comprises copolymers of acrylates and methacrylates, but the adhesive film does not comprise ceramic powder.

2. A composite green ceramic body as claimed in claim 1, wherein the adhesive film has a thickness of from 2 to 50 μm.

3. The composite green ceramic body as claimed in claim 2, wherein the adhesive film has a thickness of from 5 to 25 μm.

4. A composite green ceramic body as claimed in claim 1, wherein a mixture of derivatives of acrylic acid and/or methacrylic acid corresponding to the formula:

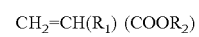

where
$R_1$=H or $CH_3$ and
$R_2$=a branched or unbranched alkyl chain having from 2 to 20 carbon atoms, and
olefinically unsaturated monomers having functional groups,
is used as starting material for the adhesive film.

5. A composite green ceramic body as claimed in claim 4, wherein crosslinkers, photoinitiators, resins or mixtures thereof have been added to the adhesive film.

6. A composite green ceramic body as claimed in claim 1, wherein crosslinkers, photoinitiators, resins or mixtures thereof have been added to the adhesive film.

7. A composite green ceramic body as claimed in claim 6, wherein one or more additives selected from the group consisting of aging inhibitors, light stabilizers, agents to protect against ozone, fatty acids, compounding aids, and accelerators have been added to the adhesive film.

8. A method of producing the composite green ceramic body of claim 1, comprising:
(a) applying an adhesive film to at least one region and at least one side of a first green ceramic body, said adhesive film being applied attached on one side to a release liner, wherein the adhesive film is oriented and comprises copolymers of acrylates and methacrylates, but the adhesive film does not comprise ceramic powder;
(b) removing the release liner and adhesively bonding the first green ceramic body with a second green ceramic body; and
(c) optionally, adhesively bonding one or more additional green ceramic body/bodies.

9. A method of producing a composite green ceramic body as claimed in claim 8, wherein after applying the adhesive film and removing the release liner, the adhesive bonding of the first and second green ceramic bodies is by means of pressure.

10. A method of producing a composite green ceramic body as claimed in claim 8, wherein the first and second green ceramic bodies are produced from green ceramic sheets with at least two green ceramic sheets adhesively bonded to one another, wherein the at least two green sheets are unmetallized, metallized or mixtures thereof.

11. A method of producing a composite green ceramic body as claimed in claim 8, wherein processing is carried out continuously from rolls.

12. A method of sintering a ceramic which comprises:
(a) subjecting the composite green ceramic body of claim 1 to at least one heat treatment during which the polymer matrix of the green ceramic sheets is thermally decomposed and/or vaporized;
(b) decomposing the adhesive film of the composite green ceramic body; and
(c) sintering the composite green ceramic body to a ceramic.

13. The method of claim 12, wherein there is no drying step.

14. The method of claim 13, wherein sintering is carried out at temperatures of from 700° C. to 2000° C.

* * * * *